(12) United States Patent
Lee

(10) Patent No.: US 6,858,873 B2
(45) Date of Patent: Feb. 22, 2005

(54) SEMICONDUCTOR DIODE HAVING A SEMICONDUCTOR DIE WITH A SUBSTRATE AND MULTIPLE FILMS APPLIED THEREOVER

(76) Inventor: Ming-Kwei Lee, 4F-4, No. 171, Pi-Chung St., Yen-Cheng Dist., Kaohsiung City (TW)

( * ) Notice: Subject to any disclaimer, the term of this patent is extended or adjusted under 35 U.S.C. 154(b) by 70 days.

(21) Appl. No.: 10/052,466

(22) Filed: Jan. 23, 2002

(65) Prior Publication Data

US 2003/0136965 A1 Jul. 24, 2003

(51) Int. Cl.$^7$ .............................................. H01L 29/267
(52) U.S. Cl. ........................................ 257/81; 257/99
(58) Field of Search .............................. 257/81, 79, 84, 257/99, 46

(56) References Cited

U.S. PATENT DOCUMENTS

| | | | | |
|---|---|---|---|---|
| 5,357,121 A | * | 10/1994 | Miyashita et al. | 257/79 |
| 6,107,644 A | * | 8/2000 | Shakuda et al. | 257/79 |
| 6,169,294 B1 | * | 1/2001 | Biing-Jye et al. | 257/79 |
| 6,204,512 B1 | * | 3/2001 | Nakamura et al. | 257/13 |
| 6,410,940 B1 | * | 6/2002 | Jiang et al. | 257/82 |
| 6,465,808 B2 | * | 10/2002 | Lin | 257/81 |
| 6,614,056 B1 | * | 9/2003 | Tarsa et al. | 257/91 |
| 2002/0047128 A1 | * | 4/2002 | Song et al. | 257/82 |

* cited by examiner

Primary Examiner—Eddie Lee
Assistant Examiner—Douglas W. Owens

(57) ABSTRACT

A semiconductor diode has a semiconductor die that includes a substrate, a first semiconductor film, a second semiconductor film, a first metal contact, and a second metal contact. The semiconductor die defines two diagonally opposite first corners and two diagonally opposite second corners. The first semiconductor film has an exposed area that is exposed from the second semiconductor film and that extends between one of the first corners and one of the second corners. The first metal contact is formed on the exposed area and has an extension section and a wire-bonding section that has a width greater than that of the extension section and a length less than that of the extension section. The second metal contact extends between the other one of the first corners and the other one of the second corners and has an extension section and a wire-bonding section that has a width greater than that of the extension section and a length less than that of the extension section.

17 Claims, 4 Drawing Sheets

SEMICONDUCTOR DIODE HAVING A SEMICONDUCTOR DIE WITH A SUBSTRATE AND MULTIPLE FILMS APPLIED THEREOVER

BACKGROUND OF THE INVENTION

1. Field of the Invention

This invention relates to a semiconductor diode having a semiconductor die that includes two opposite symmetrical electrodes disposed adjacent to and extending along edges of the semiconductor die, and to a method for manufacturing the same.

2. Description of the Related Art

Light emitting diodes (LED) are wildly used in various applications, such as illuminating devices, and displays for personal computer and cellular phones.

FIG. 1 illustrates a conventional semiconductor diode 7 which includes a p-electrode metal contact 71 and an n-electrode metal contact 72 that are respectively deposited at two diagonally opposite corners of the diode 7. When an electric current passes through the p-electrode metal contact 71 and the n-electrode metal contact 72, an active region in the diode 7 emits light that passes through the upper surface 73 of the diode 7.

The conventional diode 7 has disadvantages in that since the electric current tends to pass through the shortest distance from the p-electrode metal contact 71 to the n-electrode metal contact 72 by virtue of a smaller resistance for the shortest distance, there will be a much higher current density in an area proximate to a diagonal line defined by the two corners and a negligible amount of current in an area that is distal from the diagonal line. As a consequence, the active region in the diode 7 for emitting light is not effectively utilized, thereby resulting in a low light-emitting efficiency for the conventional diode 7.

SUMMARY OF THE INVENTION

Therefore, the object of the present invention is to provide a semiconductor diode that is capable of overcoming the aforementioned drawbacks.

Another object of the present invention is to provide a method for manufacturing the semiconductor diode of this invention.

According to one aspect of the present invention, there is provided a semiconductor diode comprising a semiconductor die that includes a substrate, a first semiconductor film formed on the substrate, a second semiconductor film formed on the first semiconductor film, a first metal contact formed on the first semiconductor film, and a second metal contact formed on the second semiconductor film. One of the first and second semiconductor films is made of an n-type semiconductor material. The other one of the first and second semiconductor films is made of a p-type semiconductor material. The semiconductor die has two opposing first side edges and two opposing second side edges which cooperate with the first side edges to define thereamong two diagonally opposite first corners and two diagonally opposite second corners. The first semiconductor film has an exposed area that is exposed from the second semiconductor film adjacent to one of the first side edges and that extends between said one of the first corners and one of the second corners. The first metal contact has a first strip portion that is formed on the exposed area, and a first bonding portion that extends from and that has a width greater than that of the first strip portion and a length less than that of the first strip portion. The second metal contact is disposed adjacent to the other one of the first side edges and has a second strip portion that extends between the other one of the first corners and the other one of the second corners, and a second bonding portion that extends from and that has a width greater than that of the second strip portion and a length less than that of the second strip portion.

According to another aspect of the present invention, there is provided a method for manufacturing semiconductor diodes. The method comprises the steps of: preparing a substrate; forming a first semiconductor film on the substrate; forming a second semiconductor film on the first semiconductor film, wherein one of the first and second semiconductor films is made of an n-type semiconductor material, and the other one of the first and second semiconductor films is made of a p-type semiconductor material; selectively masking and etching the second semiconductor film to define a plurality of orderly arranged exposed areas on the first semiconductor film which are exposed from the second semiconductor film; forming a plurality of orderly arranged first metal contacts on the exposed areas of the first semiconductor film, respectively, and a plurality of second metal contacts on the second semiconductor film, each of the second metal contacts being associated with a respective one of the first metal contacts; and dicing assembly of the substrate, the first semiconductor film, the second semiconductor film, the first metal contacts, and the second metal contacts to form a plurality of semiconductor dies, each of which has two opposing first side edges and two opposing second side edges which cooperate with the first side edges to define thereamong two diagonally opposite first corners and two diagonally opposite second corners. The exposed area on the first semiconductor film of each of the semiconductor dies is disposed adjacent to one of the first side edges and extends between one of the first corners and one of the second corners. The first metal contact of each of the semiconductor dies has a first strip portion that is formed on the exposed area, and a first bonding portion that extends from and that has a width greater than that of the first strip portion and a length less than that of the first strip portion. The second metal contact of each of the semiconductor dies is disposed adjacent to the other one of the first side edges and has a second strip portion that extends between the other one of the first corners and the other one of the second corners, and a second bonding portion that extends from and that has a width greater than that of the second strip portion and a length less than that of the second strip portion.

BRIEF DESCRIPTION OF THE DRAWINGS

In drawings which illustrate an embodiment of the invention.

DETAILED DESCRIPTION OF THE PREFERRED EMBODIMENT

The method for manufacturing semiconductor diodes according to this invention includes the steps of: preparing a substrate; forming a first semiconductor film (preferably an epilayer) on the substrate; forming a second semiconductor film (preferably an epilayer) on the first semiconductor film, wherein one of the first and second semiconductor films is made of an n-type semiconductor material, and the other one of the first and second semiconductor films is made of a p-type semiconductor material; selectively masking and etching the second semiconductor film to define a plurality of orderly arranged exposed areas on the first semiconductor film which are exposed from the second semiconductor film; forming a plurality of orderly arranged first metal contacts on the exposed areas of the first semiconductor film, respectively, and a plurality of second metal contacts on the second semiconductor film, each of the second metal contacts being associated with a respective one of the first metal contacts; and dicing assembly of the substrate, the first semiconductor film, the second semiconductor film, the first metal contacts, and the second metal contacts to form a plurality of semiconductor dies, each of which has two opposing first side edges and two opposing second side edges which cooperates with the first side edges to define thereamong two diagonally opposite first corners and two diagonally opposite second corners. The exposed area on the first semiconductor film of each of the semiconductor dies is disposed adjacent to one of the first side edges and extends between one of the first corners and one of the second corners. The first metal contact of each of the semiconductor dies has a first strip portion that is formed on the exposed area, and a first bonding portion that extends from and that has a width greater than that of the first strip portion and a length less than that of the first strip portion. The second metal contact is disposed adjacent to the other one of the first side edges and has a second strip portion that extends between the other one of the first corners and the other one of the second corners, and a second bonding portion that extends from and that has a width greater than that of the second strip portion and a length less than that of the second strip portion. The first and second bonding portions can be respectively disposed at arbitrary positions on the first and second strip portions. Preferably, the first bonding portion is formed on the one of the first corners, the first strip portion extends from the first bonding portion to the one of the second corners, the second bonding portion is formed on the other one of the first corners, and the second strip portion extends from the second bonding portion to the other one of the second corners.

Figure 1:
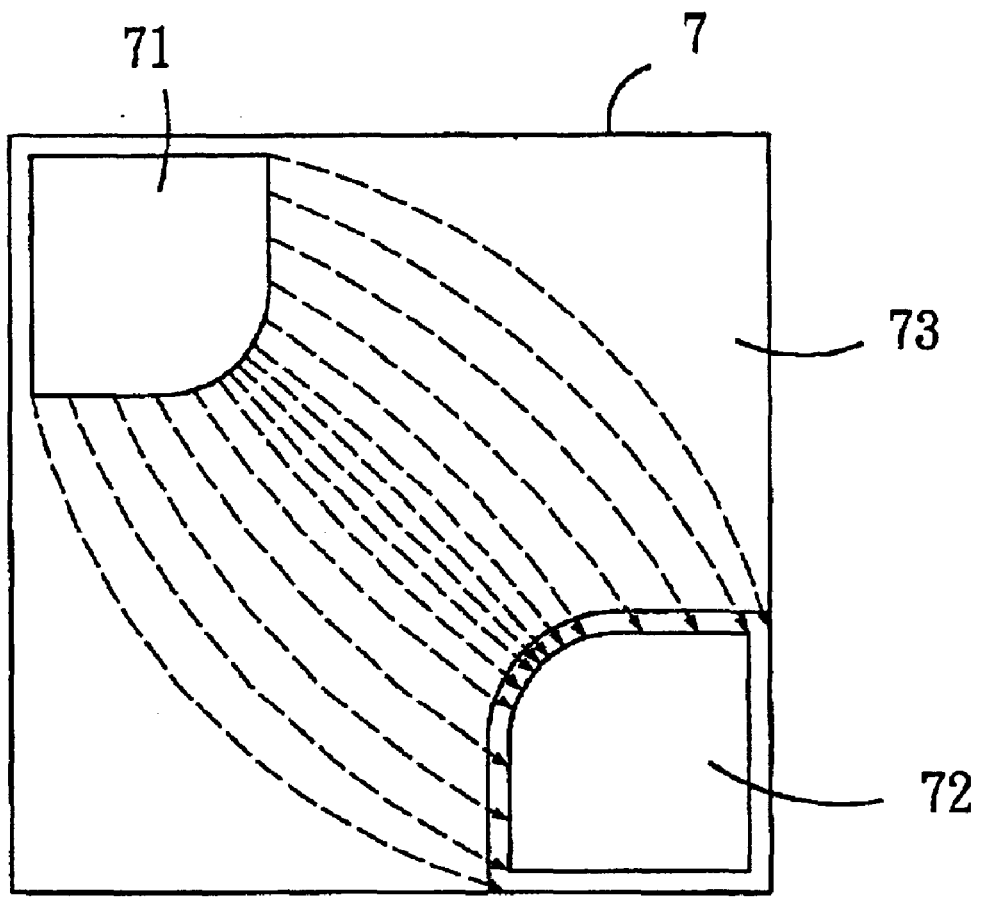
FIG. 1 illustrates a conventional semiconductor diode having two diagonally opposite electrodes.
Figure 2:
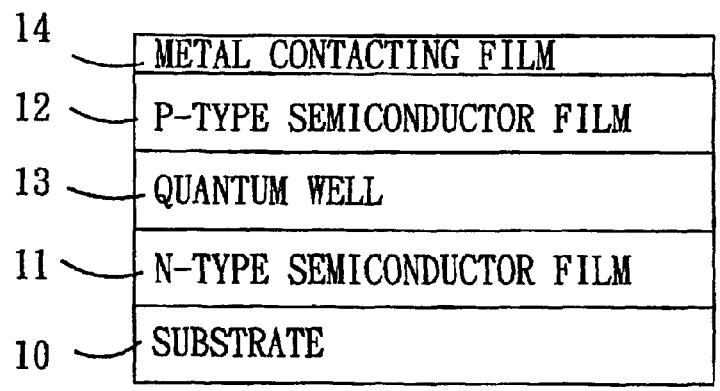
FIG. 2 illustrates formation of an assembly of an n-type semiconductor film, a quantum well, a p-type semiconductor film, and an ohmic metal contacting film on a substrate according to a method for manufacturing semiconductor diodes embodying this invention.
Figure 3:
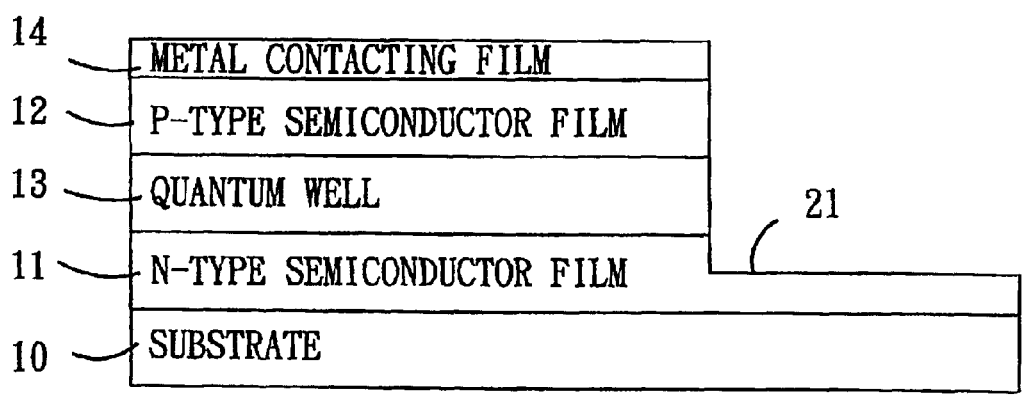
FIG. 3 illustrates formation of an exposed area on the n-type semiconductor film of the assembly of FIG. 2 according to the method of this invention.
Figure 4:
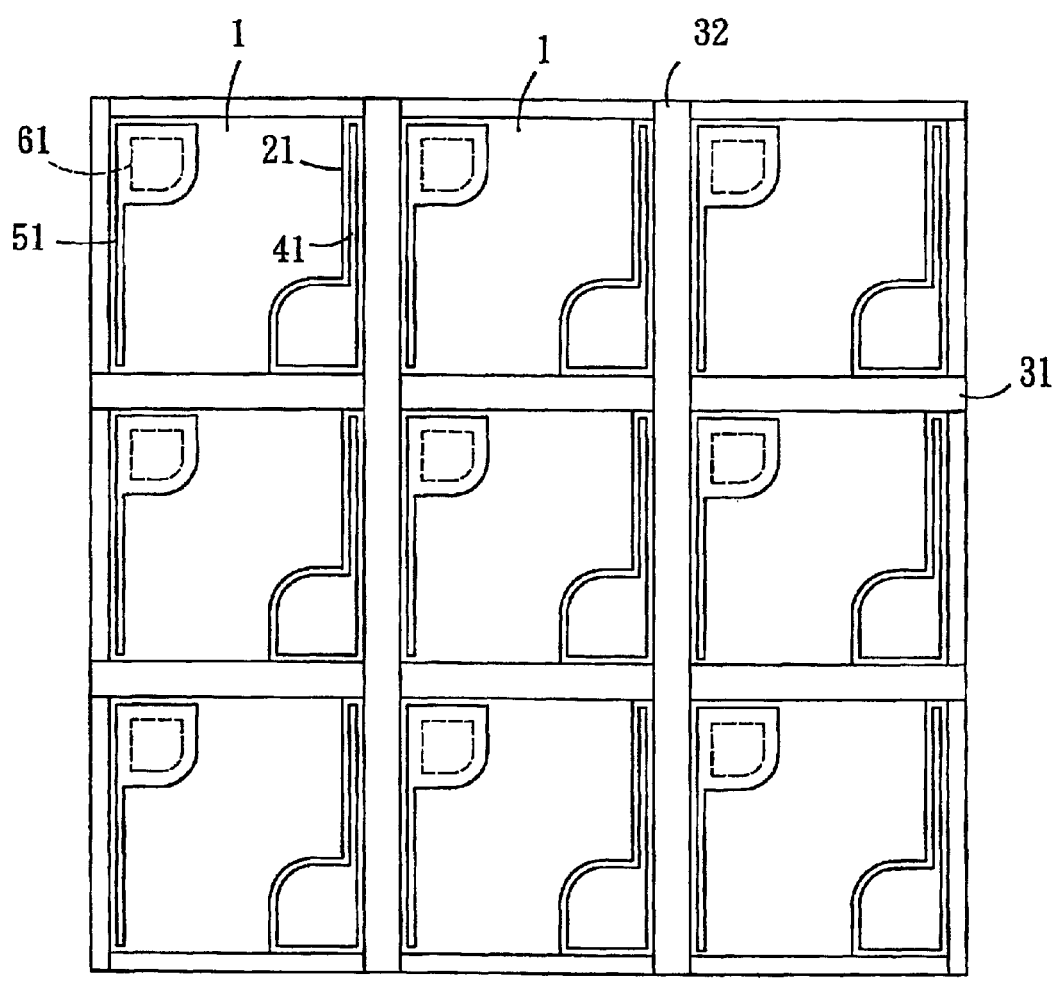
FIGS. 4 and 5 illustrate formation of cutting lines, an n-electrode metal contact, and a p-electrode metal contact on the assembly of FIG. 3 according to the method of this invention.
Figure 5:
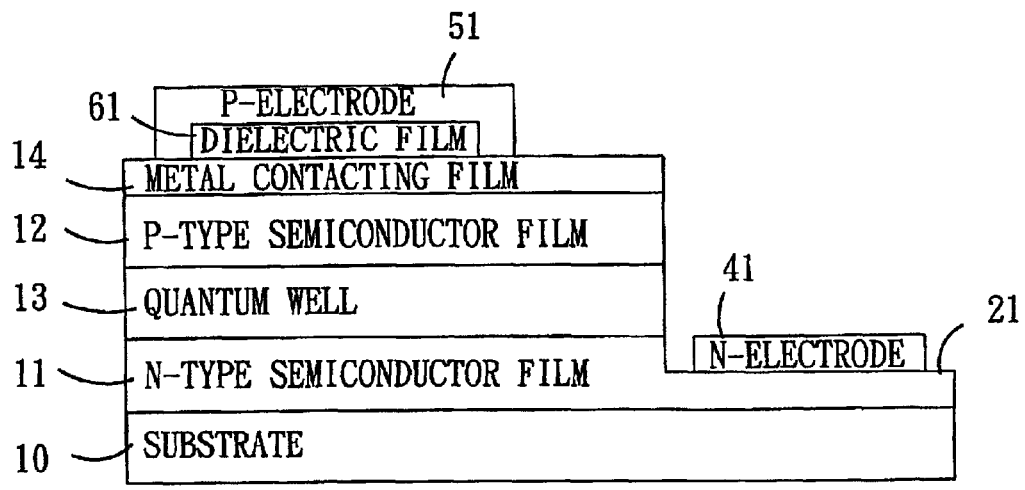
Figure 6:
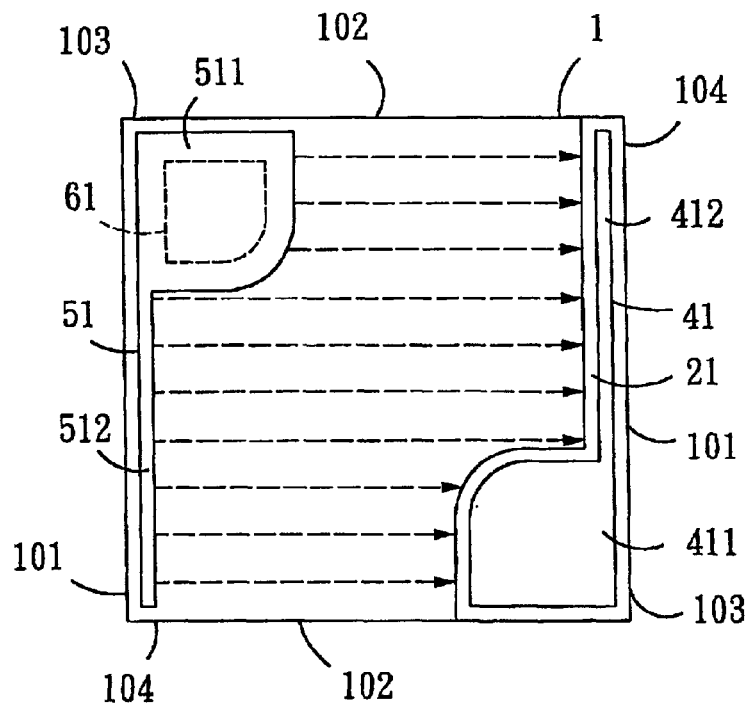
FIG. 6 illustrates a preferred embodiment of a semiconductor diode formed according to the method of this invention.

FIGS. 2 to 6 illustrate the consecutive steps for the formation of the semiconductor diodes of this invention in accordance with the preferred embodiment of the method of this invention.

The processing steps in the preferred embodiment of the method of this invention include: preparing a substrate 10; forming an n-type semiconductor film 11 on the substrate 10; forming a quantum well 13 on the n-type semiconductor film 11; forming a p-type semiconductor film 12 on the quantum well 13; forming a thin ohmic metal contacting film 14 on the p-type semiconductor film 12, which can be made from nickel or indium tin oxide (ITO) and which has a thickness of about 100 Å and a transparency of about 90%; selectively masking and etching the ohmic metal contacting film 14, the p-type semiconductor film 12, the quantum well 13, and an upper portion of the n-type semiconductor film 11 to define a plurality of orderly arranged exposed areas 21 on the n-type semiconductor film 11 which are exposed from the p-type semiconductor film 12 and the metal contacting film 14; selectively masking assembly of the metal contacting film 14, the p-type semiconductor film 12, the quantum well 13, the n-type semiconductor film 11, and the substrate 10 to define a plurality of intersecting first and second cutting lines 31, 32 on the assembly; forming a plurality of orderly arranged n-electrode metal contacts 41 (only one contact is shown) on the exposed areas 21 of the n-type semiconductor film 11, respectively, via vapor deposition of aluminum or titanium by employing photo-masking and lift-off techniques; forming a plurality of orderly arranged dielectric films 61 (only one contact is shown) on the metal contacting film 14; selectively forming a plurality of p-electrode metal contacts 51 (only one contact is shown) on the dielectric films 61, respectively, via vapor deposition of aluminum or titanium by employing photo-masking and lift-off techniques; and dicing assembly of the substrate 10, the n-type semiconductor film 11, the quantum well 13, the p-type semiconductor film 12, the metal contacting film 14, the dielectric films 61, the n-electrode metal contacts 41, and the p-electrode metal contacts 51 along the intersecting first and second cutting lines 31, 32 to form a plurality of semiconductor dies 1, each of which includes one of the n-electrode metal contacts 41 and an associated one of the p-electrode metal contacts 51 and each of which has two parallel first side edges 101 and two parallel second side edges 102 that interconnect the first side edges 101 to define thereamong two diagonally opposite first corners 103 and two diagonally opposite second corners 104.

The exposed area 21 on the n-type semiconductor film 11 of each of the semiconductor dies 1 extends from one of the first corners 103 along one of the first side edges 101 to one of the second corners 104. The n-electrode metal contact 41 of each of the semiconductor dies 1 is formed on and extends along the exposed area 21 from the specified one of the first corners 103 to the specified one of the second corners 104. The p-electrode metal contact 51 of each of the semiconductor dies extends from the other one of the first corners 103 along the other one of the first side edges 101 to the other one of the second corners 104. The n-electrode metal contact 41 has a first wire-bonding section 411 disposed at the specified one of the first corners 103, and an elongated first extension section 412 extending and reducing from the first wire-bonding section 411 to the specified one of the second corners 104. Similarly, the p-electrode metal contact 51 has a second wire-bonding section 511 disposed at the other one of the first corners 103, and an elongated second extension section 512 extending and reducing from the second wire-bonding section 511 to the other one of the second corners 104. The second wire-bonding section 511 of each of the p-electrode metal contacts 51 has a geometric dimension greater than that of the respective dielectric film 61, and has a central portion overlapping with the respective dielectric film 61, and a peripheral edge in electrical contact with the metal contacting film 14 so as to prevent an electric current from concentrating at the second wire-bonding section 511 and so as to rapidly and evenly distribute the electric current through the second wire-bonding section 511 and the second extension section 512.

The semiconductor dies 1 thus formed are then subjected to wire bonding and packaging with epoxy resin to form semiconductor diodes.

The substrate 10 is preferably made of a material selected from a group consisting of sapphire and silicon carbide. The n-type semiconductor film 11 is preferably made of n-doped GaN (Gallium nitride) material The p-type semiconductor film 12 is preferably made of p-doped GaN material.

By virtue of extending the n-electrode metal contact 41 from the specified one of the first corners 103 to the specified one of the second corners 104 of each semiconductor die 1, and the p-electrode metal contact 51 from the other one of the first corners 103 to the other one of the second corners 104 of each semiconductor die 1, the electric current can be distributed uniformly across the quantum well 13 (see FIG. 6, wherein the broken arrow lines schematically illustrate how electric current is distributed in the semiconductor die 1 of this invention) thereby increasing the light-emitting efficiency of the semiconductor diode of this invention.

With the invention thus explained, it is apparent that various modifications and variations can be made without departing from the spirit of the present invention. It is therefore intended that the invention be limited only as recited in the appended claims.

I claim:

1. A semiconductor diode comprising:
   a semiconductor die including a substrate, a first semiconductor film formed on said substrate, a second semiconductor film formed on said first semiconductor film, a first metal contact formed on said first semiconductor film, and a second metal contact formed on said second semiconductor film, one of said first and second semiconductor films being made of an n-type semiconductor material, the other one of said first and second semiconductor films being made of a p-type semiconductor material, said semiconductor die having two opposing first side edges a and b and two opposing second side edges c and d which cooperate with said first side edges a and b to define two diagonally opposite first corners a and b and two diagonally opposite second corners c and d, said first semiconductor film having an exposed area that is exposed from said second semiconductor film adjacent to first side edge a and that extends between said first corner a and said second corner c, said first metal contact having a first strip portion that is formed on said exposed area, and a first bonding portion that extends from and that has a width greater than that of said first strip portion and a length less than that of said first strip portion, said second metal contact having a second strip portion that is disposed adjacent to said first side edge b and that extends between said first corner b and said second corner d, and a second bonding portion that extends from and that has a width greater than that of said second strip portion and a length less than that of said second strip portion, said first bonding portion being formed on said one of said first corners a and b, said first strip portion extending from said first bonding portion to said one of said second corners c and d, said second bonding portion being formed on the other side of said first corners a and b, said second strip portion extending from said second bonding portion to the other one of said second corners c and d.

2. The semiconductor diode of claim 1, further comprising a quantum well sandwiched between said first and second semiconductor films.

3. The semiconductor diode of claim 1, further comprising an ohmic metal contacting film sandwiched between said second semiconductor film and said second metal contact.

4. The semiconductor diode of claim 3, further comprising a dielectric film sandwiched between said second metal contact and said metal contacting film, said dielectric film having a geometric dimension less than that of said second metal contact such that said second metal contact is in electrical contact with said metal contacting film.

5. The semiconductor diode of claim 1, wherein said substrate is made of a material selected from a group consisting of sapphire and silicon carbide.

6. The semiconductor diode of claim 1, wherein said n-type semiconductor material is n-doped GaN material, and said p-type semiconductor material is p-doped GaN material.

7. A semiconductor diode comprising:
   a semiconductor die including a substrate, a first semiconductor film formed on said substrate, a second semiconductor film formed on said first semiconductor film, a first metal contact formed on said first semiconductor film, and a second metal contact formed on said second semiconductor film, one of said first and second semiconductor films being made of an n-type semiconductor material, the other one of said first and second semiconductor films being made of a p-type semiconductor material, said semiconductor die having two opposing first side edges a and b and two opposing second side edges c and d which cooperate with said first side edges a and b to define two diagonally opposite first corners a and b and two diagonally opposite second corners c and d, said first semiconductor film having an exposed area that is exposed from said second semiconductor film adjacent to first side edge a and that extends between said first corner a and said second corner c, said first metal contact having a first strip portion that is formed on said exposed area, and a first bonding portion that extends from and that has a width greater than that of said first strip portion and a length less than that of said first strip portion, said second metal contact having a second strip portion that is disposed adjacent to said first side edge b and that extends between said first corner b and said second corner d, and a second bonding portion that extends from and that has a width greater than that of said second strip portion and a length less than that of said second strip portion, said semiconductor diode further comprising a quantum well sandwiched between said first and second semiconductor films.

8. The semiconductor diode of claim 7, wherein said first bonding portion is formed on said one of said first corners a and b, said first strip portion extending from said first bonding portion to said one of said second corners c and d, said second bonding portion being formed on the other one of said first corners a and b, said second strip portion extending from said second bonding portion to the other one of said second corners c and d.

9. The semiconductor diode of claim 7, further comprising an ohmic metal contacting film sandwiched between said second semiconductor film and said second metal contact.

10. The semiconductor diode of claim 9, further comprising a dielectric film sandwiched between said second metal contact and said metal contacting film, said dielectric film having a geometric dimension less than that of said second metal contact such that said second metal contact is in electrical contact with said metal contacting film.

11. The semiconductor diode of claim 7, wherein said substrate is made of a material selected from a group consisting of sapphire and silicon carbide.

12. The semiconductor diode of claim 7, wherein said n-type semiconductor material is n-doped GaN material, and said p-type semiconductor material is p-doped GaN material.

13. A semiconductor diode comprising:

a semiconductor die including a substrate, a first semiconductor film formed on said substrate, a second semiconductor film formed on said first semiconductor film, a first metal contact formed on said first semiconductor film, and a second metal contact formed on said second semiconductor film, one of said first and second semiconductor films being made of an n-type semiconductor material, the other one of said first and second semiconductor films being made of a p-type semiconductor material, said semiconductor die having two opposing first side edges a and b and two opposing second side edges c and d which cooperate with said first side edges a and b to define two diagonally opposite first corners a and b and two diagonally opposite second corners c and d, said first semiconductor film having an exposed area that is exposed from said second semiconductor film adjacent to first side edge a and that extends between said first corner a and said second corner c, said first metal contact having a first strip portion that is formed on said exposed area, and a first bonding portion that extends from and that has a width greater than that of said first strip portion and a length less than that of said first strip portion, said second metal contact having a second strip portion that is disposed adjacent to said first side edge b and that extends between said first corner b and said second corner d, and a second bonding portion that extends from and that has a width greater than that of said second strip portion and a length less than that of said second strip portion, said semiconductor diode further comprising an ohmic metal contacting film sandwiched between said second semiconductor film and said second metal contact and a dielectric film sandwiched between said second metal contact and said metal contacting film, said dielectric film having a geometric dimension less than that of said second metal contact such that said second metal contact is in electrical contact with said metal contacting film.

14. The semiconductor diode of claim 13, wherein said first bonding portion is formed on said one of said first corners a and b, said first strip portion extending from said first bonding portion to said one of said second corners c and d, said second bonding portion being formed on the other one of said first corners a and b, said second strip portion extending from said second bonding portion to the other one of said second corners c and d.

15. The semiconductor diode of claim 13, further comprising a quantum well sandwiched between said first and second semiconductor films.

16. The semiconductor diode of claim 13, wherein said substrate is made of a material selected from a group consisting of sapphire and silicon carbide.

17. The semiconductor diode of claim 13, wherein said n-type semiconductor material is n-doped GaN material, and said p-type semiconductor material is p-doped GaN material.

* * * * *

UNITED STATES PATENT AND TRADEMARK OFFICE
CERTIFICATE OF CORRECTION

PATENT NO. : 6,858,873 B2  Page 1 of 1
APPLICATION NO. : 10/052466
DATED : February 22, 2005
INVENTOR(S) : Lee It is certified that error appears in the above-identified patent and that said Letters Patent is hereby corrected as shown below:

On the title page insert item (73),
-- CHIA TA WORLD CO., LTD.
  No. 16, Lane 317, Chung-Shan N. Rd.
  Yung-Kang City, Tainan Hsien, Taiwan --.

Signed and Sealed this

Thirtieth Day of January, 2007

JON W. DUDAS
*Director of the United States Patent and Trademark Office*